United States Patent
Motoyama et al.

(10) Patent No.: US 12,349,598 B2
(45) Date of Patent: Jul. 1, 2025

(54) MRAM DEVICE STRUCTURE

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 17/814,245

(22) Filed: Jul. 22, 2022

(65) Prior Publication Data

US 2024/0032436 A1    Jan. 25, 2024

(51) Int. Cl.
| | |
|---|---|
| *H10N 50/10* | (2023.01) |
| *H10B 61/00* | (2023.01) |
| *H10N 50/01* | (2023.01) |
| *H10N 50/80* | (2023.01) |

(52) U.S. Cl.
CPC ............ *H10N 50/10* (2023.02); *H10B 61/00* (2023.02); *H10N 50/01* (2023.02); *H10N 50/80* (2023.02)

(58) Field of Classification Search
CPC ......... H10N 50/10; H10N 50/80; H10B 61/00
See application file for complete search history.

(56) References Cited

U.S. PATENT DOCUMENTS

| | | | |
|---|---|---|---|
| 8,421,137 B2 | 4/2013 | Li | |
| 9,306,158 B2 | 4/2016 | Tsai | |
| 9,553,257 B1 | 1/2017 | Annunziata | |
| 9,559,294 B2 | 1/2017 | Hsu | |
| 9,564,577 B1 | 2/2017 | Hsu | |
| 10,198,372 B2 | 2/2019 | Moon | |
| 11,063,208 B2 | 7/2021 | Chuang | |
| 11,171,284 B2 | 11/2021 | Liao | |
| 2016/0225979 A1* | 8/2016 | Hsu | ............ H10N 50/10 |
| 2018/0248112 A1* | 8/2018 | Chuang | ............ H10N 50/10 |
| 2021/0343930 A1* | 11/2021 | Hsu | ............ H01F 41/32 |
| 2021/0351342 A1* | 11/2021 | Yui | ............ G01R 33/098 |
| 2022/0037399 A1* | 2/2022 | Lin | ............ H10N 70/841 |

* cited by examiner

*Primary Examiner* — Wasiul Haider
(74) *Attorney, Agent, or Firm* — Yuanmin Cai (57) ABSTRACT

Embodiments of present invention provide a method of forming a MRAM structure. The method includes forming a magnetic tunnel junction (MTJ) stack; forming a first dielectric layer to a level above a tunnel barrier layer of the MTJ stack, the first dielectric layer partially covering the MTJ stack with a top surface of the MTJ stack being exposed; depositing an etch-stop layer covering the top surface of the MTJ stack and a top surface of the first dielectric layer; depositing a second dielectric layer covering the etch-stop layer; forming an opening in the second dielectric layer; removing a portion of the etch-stop layer above the top surface of the MTJ stack; and forming a top contact by depositing a conductive material in the opening. An MRAM structure formed thereby is also provided.

16 Claims, 7 Drawing Sheets

MRAM DEVICE STRUCTURE

BACKGROUND

The present application relates to manufacturing of semiconductor integrated circuits. More particularly, it relates to method of forming a magnetoresistive random access memory and the structure formed thereby.

With the explosion of digital information, semiconductor memory devices are playing an ever increasingly important role in the managing and organizing of this digital information through, for example, storing, retrieving, and/or transformation of this digital information. Magnetoresistive random-access memory (MRAM) is a type of non-volatile memory (NVM) capable of holding saved data even in the event that power to the memory is down or is accidentally cut off. There have been several recent developments in the technology that allow MRAM to be used successfully in specific emerging applications, as well as in not-so-new ones.

MRAM technology is based on a component known as magnetic tunnel junction (MTJ) that consists of two ferromagnetic layers separated by an insulating layer knows as a tunnel barrier layer. In a vertical MRAM device, a top and a bottom electrode may sometimes compliment the MTJ to form a vertical MTJ stack. For high performance MRAM devices based on vertical MTJ stacks, well-defined interfaces are essential for reliability and performance of the devices. However, current manufacturing process, and in particular the process in forming a top contact contacting the top electrode of a MTJ stack, may lead to short between the two ferromagnetic layers of a MTJ stack that are otherwise insulated from each other by the insulating layer.

SUMMARY

Embodiments of present invention provide a MRAM structure. The MRAM structure includes a magnetic tunnel junction (MTJ) stack; and a top contact having at least a first portion above the MTJ stack, wherein a top portion of the MTJ stack is surrounded by at least a first sidewall spacer, a top surface of the first sidewall spacer being in direct contact with the first portion of the top contact.

According to one embodiment, the MRAM structure further includes a second sidewall spacer, the second sidewall spacer surrounding the first sidewall spacer at the top portion of the MTJ stack; and a second portion of the top contact, the second portion of the top contact having an inner sidewall, the inner sidewall being in direct contact with the second sidewall spacer. In one aspect, a bottom surface of the second sidewall spacer is coplanar with a bottom surface of the second portion of the top contact.

In one embodiment, the first sidewall spacer includes silicon-nitride (SiN) and the second sidewall spacer includes a material different from that of the first sidewall spacer. In one aspect, the second sidewall spacer includes a material selected from a group consisting of SiCN, SiOCN, SiON, AlON, SiCN, $Al_2O_3$, $ZrO_2$, and $SiO_2$.

In one embodiment, the MTJ stack includes, from a bottom to a top thereof, a bottom electrode, a reference layer, a tunnel barrier layer, a free layer, and a top electrode layer, and wherein the MTJ stack sits on top of a bottom contact.

In another embodiment, the top contact and the bottom contact are part of two neighboring metal levels of a back-end-of-line (BEOL) structure.

Embodiments of present invention provide a method of forming a MRAM structure as well. The method includes forming a magnetic tunnel junction (MTJ) stack; forming a first dielectric layer to a level above a tunnel barrier layer of the MTJ stack, the first dielectric layer partially covering the MTJ stack with a top surface of the MTJ stack being exposed; depositing an etch-stop layer covering the top surface of the MTJ stack and a top surface of the first dielectric layer; depositing a second dielectric layer covering the etch-stop layer; forming an opening in the second dielectric layer; removing a portion of the etch-stop layer that is above the top surface of the MTJ stack; and forming a top contact by depositing a conductive material in the opening.

According to one embodiment, the method further includes, before forming the first dielectric layer, forming a sidewall spacer surrounding the MTJ stack, the sidewall spacer comprising silicon-nitride (SiN).

In one embodiment, removing the portion of the etch-stop layer includes removing a horizontal portion of the etch-stop layer in an anisotropic etching process, thereby leaving a vertical portion of the etch-stop layer next to the sidewall spacer.

In another embodiment, forming the opening includes etching the second dielectric layer through a selective etching process that stops at the etch-stop layer. In one aspect, the opening vertically extends below a top surface level of the MTJ stack, thereby surrounding at least a top portion of the MTJ stack.

In one embodiment, the top contact has an inner sidewall that is in direct contact with a vertical portion of the etch-stop layer.

BRIEF DESCRIPTION OF THE DRAWINGS

The present invention will be understood and appreciated more fully from the following detailed description of embodiments of present invention, taken in conjunction with accompanying drawings of which.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

Figure 1:
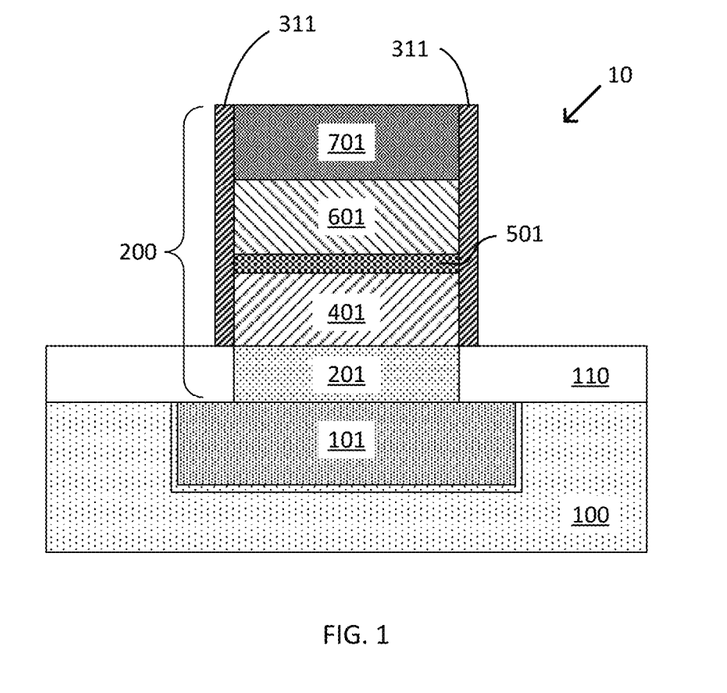
FIG. 1 is a demonstrative illustration of cross-sectional view of a MRAM device in a step of manufacturing thereof according to one embodiment of present invention.

FIG. 1 is a demonstrative illustration of cross-sectional view of a MRAM device in a step of manufacturing thereof according to one embodiment of present invention. The MRAM device may be a MRAM device 10. More particularly, embodiments of present invention provide receiving an initial semiconductor structure that may include, for example, a first interlevel dielectric (ILD) layer 100 and a metal level 101 embedded in the first ILD layer 100. In one embodiment, this initial semiconductor structure may be, for example, a part of a back-end-of-line (BEOL) structure of a semiconductor chip and the semiconductor chip may include other semiconductor structures and elements (now shown) such as, for example, frond-end-of-line (FEOL) structures including transistors and middle-of-line (MOL) structures. The metal level 101 may be, for example, a metal level 2 (M2), a metal level 3 (M3), etc., and may be made of a layer of conductive material. In one embodiment, metal level 101 may function as a bottom contact of the MRAM device 10 and thus may be referred to as a bottom contact 101.

Embodiments of present invention may further provide forming a magnetic tunnel junction (MTJ) stack 200 on top of the metal level 101. More specifically, embodiments of present invention may provide forming a bottom electrode layer 201 on top of the bottom contact 101, a first ferromagnetic layer 401 on top of the bottom electrode layer 201, a tunnel barrier layer 501 on top of the first ferromagnetic layer 401, and a second ferromagnetic layer 601 on top of the tunnel barrier layer 501, a process of which is described below in more details. Moreover, a metal hard mask 701 may be used in a patterning process in forming the stack of the first ferromagnetic layer 401, the tunnel barrier layer 501, and the second ferromagnetic layer 601. As a part of the MTJ stack 200, the metal hard mask 701 may function as a top electrode layer and thus may be referred to as a top electrode layer 701.

In one embodiment, the bottom electrode layer 201 may be a layer of tantalum-nitride (TaN) or titanium-nitride (TiN). In another embodiment, the first and second ferromagnetic layers 401 and 601 may be a first and a second layer of cobalt (Co), iron (Fe), and boron (B) based material (CoFeB) such as, for example, an alloy of Co, Fe, and B. However, embodiments of present invention are not limited in this aspect and the first and second ferromagnetic layers 401 and 601 may be of other suitable materials such as, for example, an alloy of Co and Fe (CoFe) or an alloy of nickel (Ni) and Fe (NiFe). The first and second ferromagnetic layers 401 and 601 may function with one as a reference layer and the other as a free layer, respectively, of the MTJ stack 200. For example, in one aspect the first ferromagnetic layer 401 may be or function as a reference layer and the second ferromagnetic layer 601 may be or function as a free layer. In another aspect the first ferromagnetic layer 401 may be or function as a free layer and the second ferromagnetic layer 601 may be or function a reference layer. The first ferromagnetic layer 401 may be formed to have a thickness ranging from about 2 nm to about and the second ferromagnetic layer 601 may be formed to have a thickness ranging from about 2 nm to about 30 nm. A thickness less than 2 nm or more than 30 nm is also acceptable.

In one embodiment, the tunnel barrier layer 501 may be a layer of magnesium oxide (MgO) or other suitable materials such as, for example, $A_1O_3$ and $TiO_2$ and may be formed to have a thickness ranging from about 0.6 nm to about 1.2 nm. In another embodiment, as being discussed above, the metal hard mask 701 may function as a top electrode layer of the MTJ stack 200. The metal hard mask 701 may be formed to include conductive material including, for example, tantalum (Ta), ruthenium (Ru), tungsten (W), tungsten-nitride (WN) and/or other conductive materials.

The MTJ stack 200 may be formed by etching the bottom electrode layer 201, the first ferromagnetic layer 401, the tunnel barrier layer 501, the top ferromagnetic layer 601, and the top electrode layer 701 through one or more subtractive patterning processes. For example, in one embodiment, the bottom electrode layer 201 may be formed by patterning a blanket layer of TaN or TiN through a lithographic patterning process. Following the patterning of the bottom electrode layer 201, a bottom dielectric layer 110 may be deposited through, for example, a chemical-vapor-deposition (CVD) process or atomic-layer-deposition (ALD) process, to surround the bottom electrode layer 201. Alternatively, instead of patterning the bottom electrode layer 201, a bottom dielectric layer 110 may be first deposited on top of the metal level 101 and on top of the first ILD layer 100. Subsequently, an opening may be created through, for example, a lithographic patterning process in the deposited bottom dielectric layer 110. Following the creation of the opening, TaN or TiN material may be deposited inside the opening, which is then followed by a chemical-mechanic-polishing (CMP) process, to form the bottom electrode layer 201.

Subsequently, the rest of the MTJ stack 200 may be formed. In doing so, corresponding blanket layers of the first ferromagnetic layer 401, the tunnel barrier layer 501, the second ferromagnetic layer 601, and the top electrode layer 701 may first be deposited on top of the bottom electrode layer 201 and the bottom dielectric layer 110. The top electrode layer 701 may then be patterned to form a hard mask thereof in a lithographic patterning process. Using the top electrode layer 701 as a hard mask, the first ferromagnetic layer 401, the tunnel barrier layer 501, and the second ferromagnetic layer 601 may subsequently be patterned using a directional anisotropic etching process such as, for example, a reactive-ion-etching (RIE) process to form the remaining portion of the MTJ stack 200 above the bottom electrode layer 201.

In one embodiment, the first ferromagnetic layer 401, the tunnel barrier layer 501, and the second ferromagnetic layer 601 may be substantially aligned with the bottom electrode layer 201. The alignment may be achieved through the use of alignment marks during the patterning process although sometimes slight misalignment (not shown) may occur which may be within tolerable range. After the formation of the MTJ stack 200, a sidewall spacer 311 may be formed at the sidewalls of the first ferromagnetic layer 401, the tunnel barrier layer 501, the second ferromagnetic layer 601, and the top electrode layer 701 to protect the ferromagnetic materials from oxidation and other possible contaminations. The sidewall spacer 311, which may be a first sidewall spacer, may be formed through initially depositing a conformal spacer material layer such as, for example, silicon-nitride (SiN), silicon-carbonitride (SiCN), and/or other suitable materials covering the MTJ stack 200 and the top of dielectric layer 110, and subsequently applying an anisotropic etching process such as a directional etching process to remove horizontal portions of the conformal spacer material layer. The sidewall spacer 311 may have a horizontal thickness ranging from about 1 nm to about 10 nm.

Figure 2:
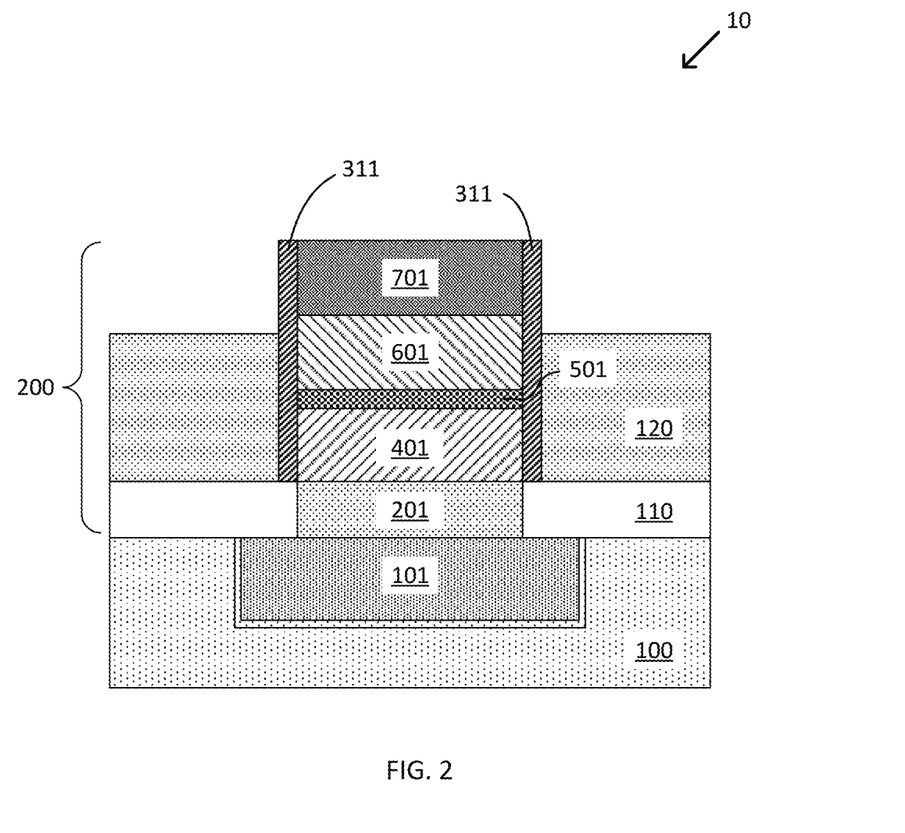
FIG. 2 is a demonstrative illustration of cross-sectional view of a MRAM device in a step of manufacturing thereof, following the step illustrated in FIG. 1, according to one embodiment of present invention.

FIG. 2 is a demonstrative illustration of cross-sectional view of a MRAM device in a step of manufacturing thereof, following the step illustrated in FIG. 1, according to one embodiment of present invention. More particularly, embodiments of present invention provide forming a first dielectric layer 120 that partially covers the MTJ stack 200. In one embodiment, the first dielectric layer 120 may be, for example, a layer of hydrogenated oxidized silicon carbon (SiCOH) formed through a flowable CVD process. The first dielectric layer 120 may be formed to have a height or thickness at least above a height level of the first ferromagnetic layer 401. In another embodiment, the first dielectric layer 120 may be formed through initially depositing a blanket layer of the first dielectric layer 120 covering the entire or a substantial portion of the MTJ stack 200. An etch-back process may subsequently be performed to recess the first dielectric layer 120 to expose at least a top portion of the MTJ stack 200 (surrounded by the sidewall spacer 311). The etch-back process may stop before reaching the height level of the first ferromagnetic layer 401. For example, the first dielectric layer 120 may be recessed to a level above the tunnel barrier layer 501 of the MTJ stack 200.

Figure 3:
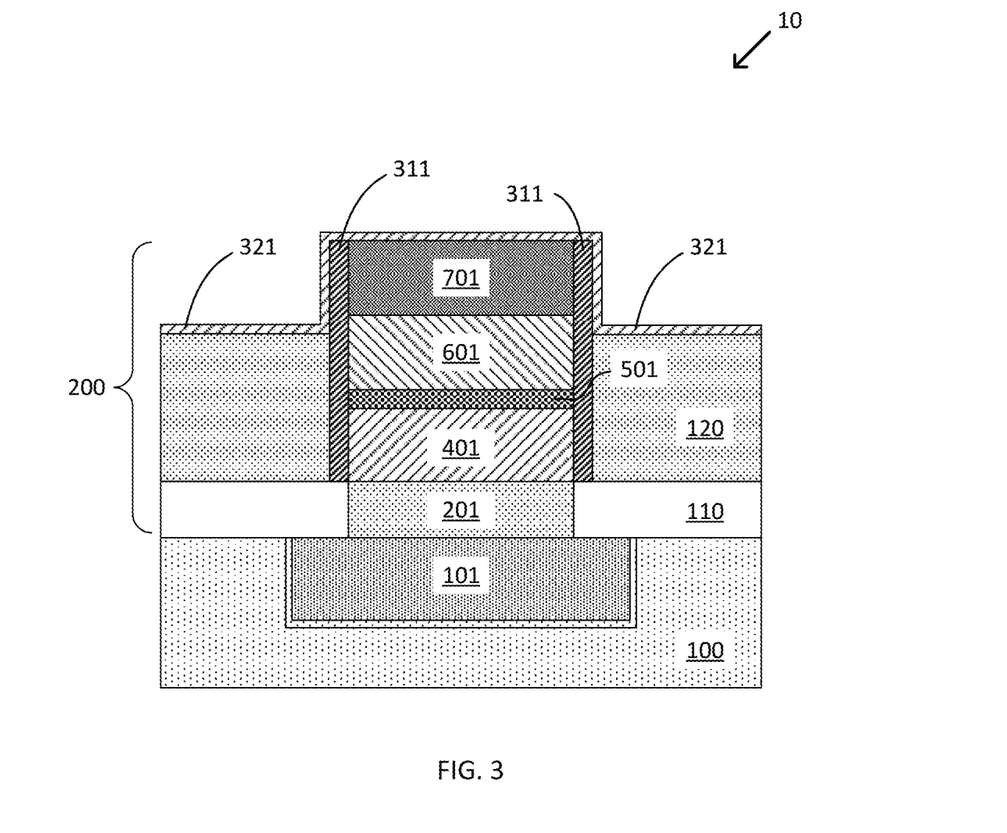
FIG. 3 is a demonstrative illustration of cross-sectional view of a MRAM device in a step of manufacturing thereof, following the step illustrated in FIG. 2, according to one embodiment of present invention.

FIG. 3 is a demonstrative illustration of cross-sectional view of a MRAM device in a step of manufacturing thereof, following the step illustrated in FIG. 2, according to one embodiment of present invention. More particularly, embodiments of present invention provide forming an etch-stop layer 321 on top of the first dielectric layer 120 and the exposed portion of the MTJ stack 200 (surrounded by the sidewall spacer 311). The etch-stop layer 321 may be a conformal layer lining the top and sidewalls of the exposed portion of the MTJ stack 200 (surrounded by the sidewall spacer 311), and may be, for example, a layer of silicon-carbon-nitride (SiCN) material that provides etch selectivity to material that may be formed thereupon later as being described below in more details. However, embodiments of present invention are not limited in this aspect. The etch-stop layer 321 may include material such as, for example, silicon-oxycarbonitride (SiOCN), silicon-oxynitride (SiON), aluminum-oxynitride (AlON), aluminum-oxide ($Al_2O_3$), zirconium-oxide ($ZrO_2$), and silicon-oxide ($SiO_2$). The etch-stop layer 321 may be formed to have a thickness ranging from about 1 nm to about 10 nm.

Figure 4:
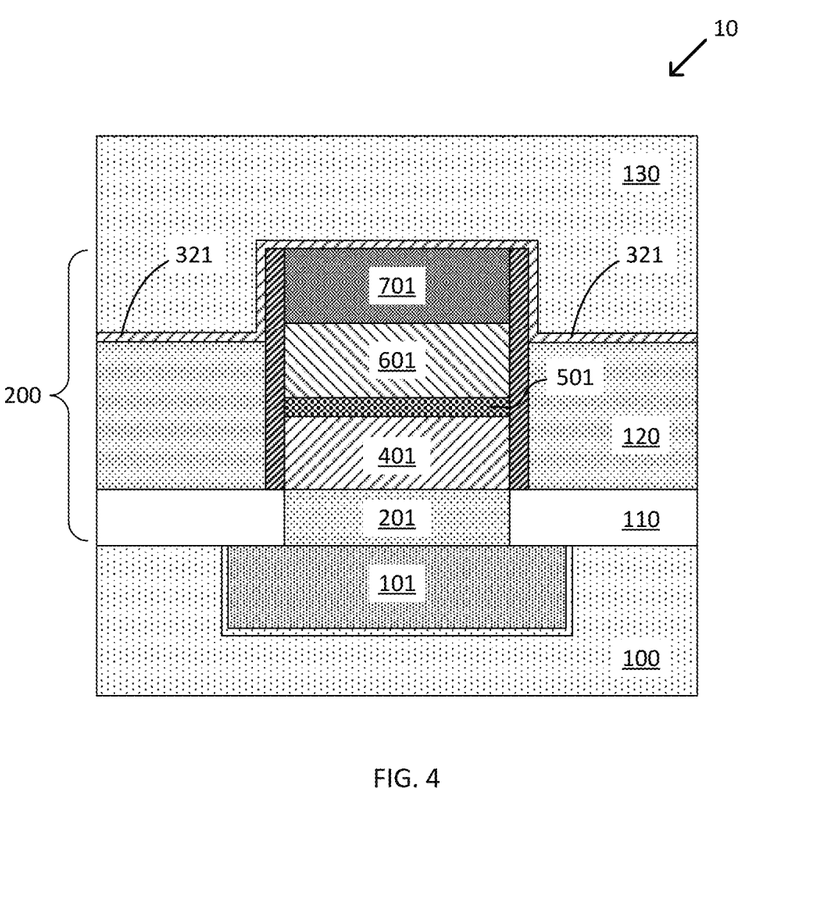
FIG. 4 is a demonstrative illustration of cross-sectional view of a MRAM device in a step of manufacturing thereof, following the step illustrated in FIG. 3, according to one embodiment of present invention.

FIG. 4 is a demonstrative illustration of cross-sectional view of a MRAM device in a step of manufacturing thereof, following the step illustrated in FIG. 3, according to one embodiment of present invention. More particularly, embodiments of present invention provide forming a second ILD layer such as a low-k dielectric layer 130 on top of the etch-stop layer 321 that covers the MTJ stack 200 and the surrounding first ILD layer 120. The low-k dielectric layer 130 may be deposited through a CVD process. For example, SiCOH and SiCN may be used as the low-k dielectric layer 130. The low-k dielectric layer 130 may have an etch selectivity that is, preferably significantly, different from that of the etch-stop layer 321. The low-k dielectric layer 130 may be formed to have a height higher than the top level of the MTJ stack 200.

Figure 5:
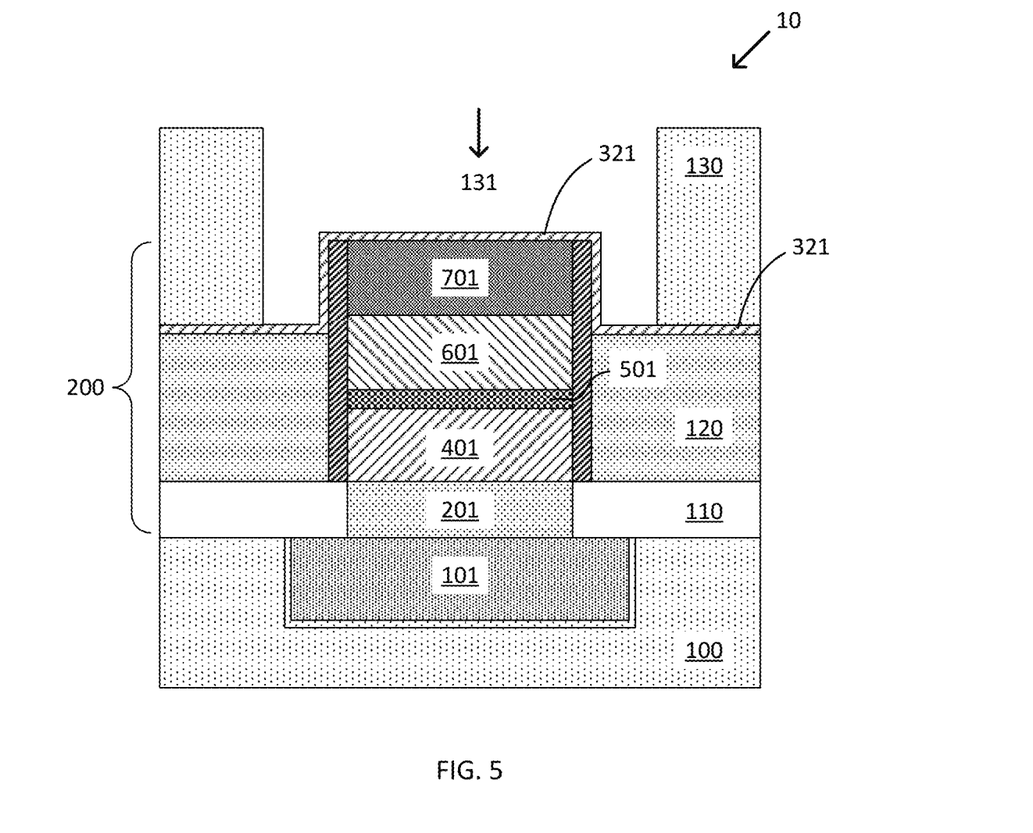
FIG. 5 is a demonstrative illustration of cross-sectional view of a MRAM device in a step of manufacturing thereof, following the step illustrated in FIG. 4, according to one embodiment of present invention.

FIG. 5 is a demonstrative illustration of cross-sectional view of a MRAM device in a step of manufacturing thereof, following the step illustrated in FIG. 4, according to one embodiment of present invention. More particularly, embodiments of present invention provide forming a top contact of the MRAM device 10. In one embodiment, the top contact may be part of a metal level above the metal level 101. In other words, the top contact and the bottom contact (metal level 101) may be two neighboring metal levels of a BEOL structure. For example, if the metal level 101 is metal level M2, the top contact may be part of metal level M3. In forming the top contact, embodiments of present invention provide forming a trench opening 131 in the dielectric layer 130 through a selective etching process. The trench opening 131 may have a width that is wider than a width (or diameter) of the MTJ stack 200.

As being described above, the low-k dielectric layer 130 has different etch selectivity than the etch-stop layer 321 and therefore the etching may stop once the etch-stop layer 321 is exposed. The trench opening 131 may extends below a level of the top surface of the MTJ stack 200 to expose at least a top portion of the MTJ stack 200 such as a portion corresponding to the top electrode layer 701 and a portion of the second ferromagnetic layer 601, both of which are surrounded by the first sidewall spacer 311 and the etch-stop layer 321. The trench opening 131 may expose a vertical portion of the etch-stop layer 321 that are next to the first sidewall spacer 311.

Here, a person skilled in the art will appreciate that with the use of the etch-stop layer 321, the creation of the trench opening 131 may avoid over-etch into the first dielectric layer 120 underneath the etch-stop layer 321. Without the etch-stop layer 321, as is in the prior art, the creation of the trench opening 131 (in a process of forming the top contact) may cause over-etch into the first dielectric layer 120 which may as well cause the removal of the first sidewall spacer 311. In the event that the over-etch is sufficiently deep to cause exposure of sidewalls of the first ferromagnetic layer 401 below the tunnel barrier layer 501, a subsequently formed top contact may cause short between the first ferromagnetic layer 401 and the second ferromagnetic layer 601 and possibly the top electrode layer and top contact above the second ferromagnetic layer 601.

Figure 6:
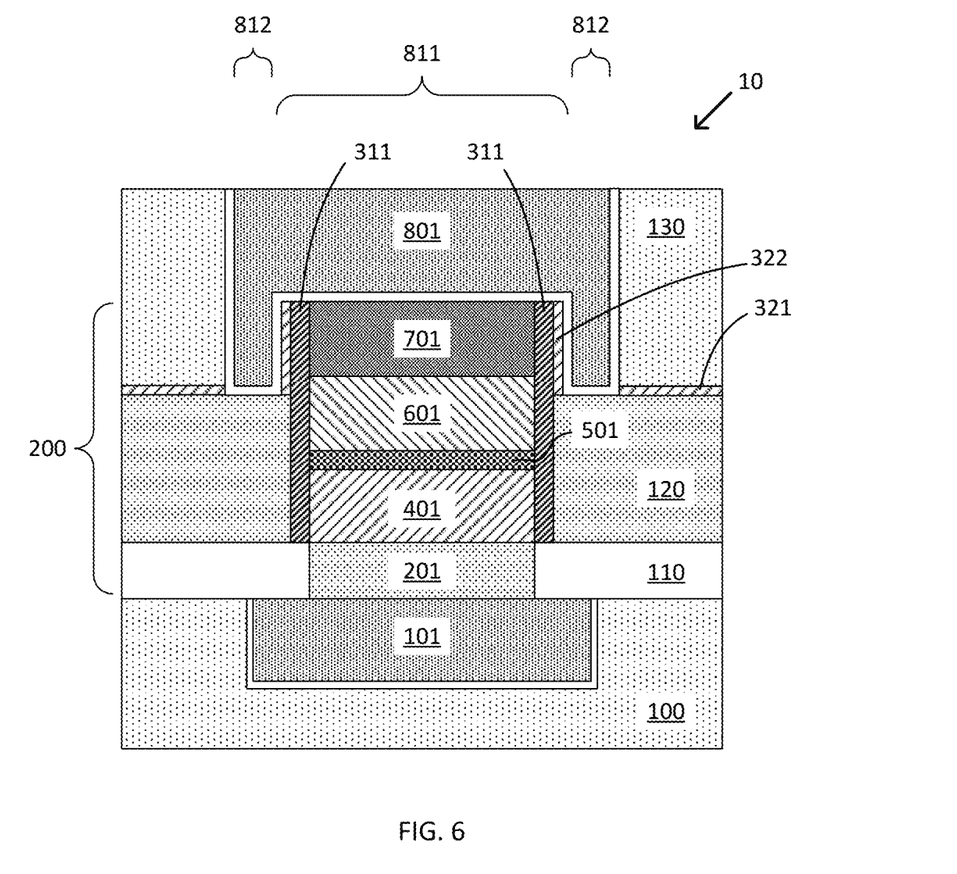
FIG. 6 is a demonstrative illustration of cross-sectional view of a MRAM device in a step of manufacturing thereof, following the step illustrated in FIG. 5, according to one embodiment of present invention.

FIG. 6 is a demonstrative illustration of cross-sectional view of a MRAM device in a step of manufacturing thereof, following the step illustrated in FIG. 5, according to one embodiment of present invention. More particularly, before depositing a conductive material to form the top contact 801, embodiments of present invention provide removing the horizontal portion of the etch-stop layer 321 to expose a top surface of the top electrode layer 701. The removal may be performed through a different etching process that is specifically designed to etch the etch-stop layer 321. The etching process may be an anisotropic etching process that leaves the vertical portion of the etch-stop layer 321 substantially un-etched and remain next to and surrounding the first sidewall spacers 311. The vertical portion of the etch-stop layer 321 may be referred to hereinafter as a second sidewall spacer 322, and the second sidewall spacer may be made of, for example, SiCN, SiOCN, SiON, AlON, $Al_2O_3$, $ZrO_2$, and $SiO_2$. The second sidewall spacer 322 surrounds the first sidewall spacer 311.

Following the exposure of the top electrode layer 701, the top contact 801 may be formed. Forming the top contact 801 may include forming a liner lining the opening in the second ILD layer of low-k dielectric layer 130 and depositing one or more conductive material in the opening above the liner. The liner may be TaN, TiN and WN and the conductive material may include, for example, tungsten (W), copper (Cu), aluminum (Al), cobalt (Co), ruthenium (Ru), and other suitable materials that are generally used for forming different metal levels in a BEOL environment.

In one embodiment, the top contact 801 may include a first portion 811 that is directly above the top surface of the MTJ stack 200, the first sidewall spacer 311, and the second sidewall spacer 322. The top contact 801 may also include a second portion 812 surrounds the first portion 811 that extends below a top surface level of the MTJ stack 200 to have an inner sidewall that is in direct contact with and surrounds the second sidewall spacer 322.

As is demonstratively illustrated in FIG. 6, the top portion of the MTJ stack 200 is surrounded by the first sidewall spacer 311, the second sidewall spacer 322 and a lower portion of the second portion 812 of the top contact 801. A top surface of the first sidewall spacer 311 and a top surface of the second sidewall spacer 322 are in direct contact with the first portion 811 of the top contact 801. In the meantime, a bottom surface of the second sidewall spacer 322 is coplanar with a bottom surface of the second portion 812 of the top contact 801. The bottom surface of the second portion 812 of the top contact 801 is above a top surface level of the first ferromagnetic layer 401 which may be a reference layer in one embodiment or a free layer in another embodiment.

According to one embodiment, the first sidewall spacer 311 and the second sidewall spacer 322 may be made of different material to have different etch selectivity. For example, the first sidewall spacer may be made of silicon-nitride (SiN) and the second sidewall spacer may be made of a material different from the first sidewall spacer such as, for example, SiCN, SiOCN, SiON, AlON, $Al_2O_3$, $ZrO_2$, and $SiO_2$.

In one embodiment, among the various layers in the MTJ stack 200, the first ferromagnetic layer 401 is a reference layer and the second ferromagnetic layer 601 is a free layer. In another embodiment, the first ferromagnetic layer 401 is a free layer and the second ferromagnetic layer 601 is a reference layer.

Figure 7:
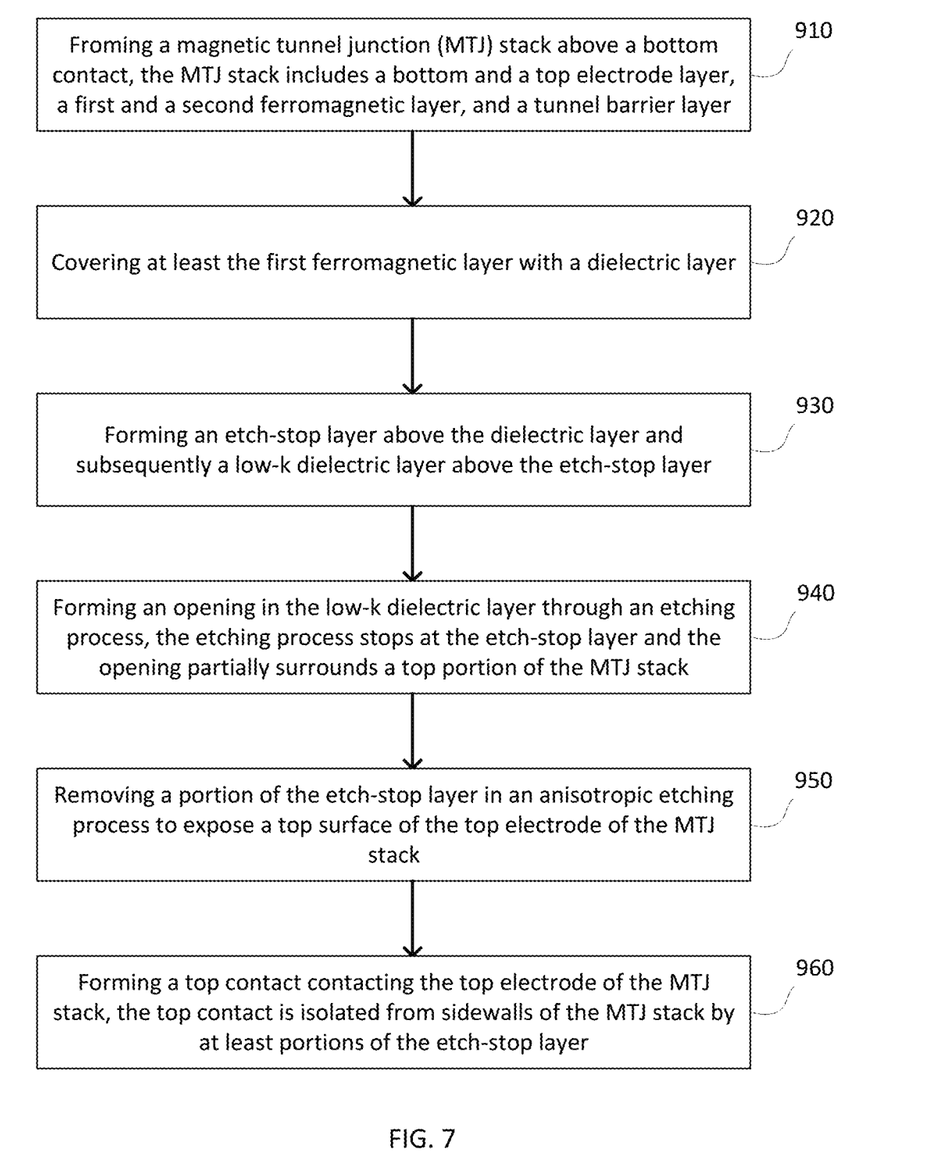
FIG. 7 is a demonstrative illustration of a flow-chart of a method of manufacturing a MRAM device according to embodiments of present invention.

FIG. 7 is a demonstrative illustration of a flow-chart of a method of manufacturing a MRAM device according to embodiments of present invention. The method includes (910) forming a magnetic tunnel junction (MTJ) stack above a bottom contact, wherein the MTJ stack includes, from a bottom to a top thereof, a bottom electrode layer, a first ferromagnetic layer, a tunnel barrier layer, a second ferromagnetic layer, and a top electrode layer; (920) covering at least the first ferromagnetic layer with a first dielectric layer, where the first ferromagnetic layer is above the bottom electrode layer and below the tunnel barrier layer; (930) forming an etch-stop layer above the first dielectric layer and subsequently an interlevel dielectric (ILD) layer of a low-k dielectric material above the etch-stop layer; (940) forming an opening in the ILD layer of low-k dielectric material through a directional and selective etching process, where the etching process stops at the etch-stop layer with the opening partially surrounding a top portion of the MTJ stack; (950) removing a portion of the etch-stop layer to expose a top surface of the top electrode of the MTJ stack; and (960) forming a top contact contacting the top electrode of the MTJ stack, where the top contact is isolated from sidewalls of the MTJ stack by at least portions of the etch-stop layer, thereby preventing short between the first ferromagnetic layer below the tunnel barrier layer and the second ferromagnetic layer above the tunnel barrier layer which may be potentially caused by the top contact.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM structure comprising:
a magnetic tunnel junction (MTJ) stack;
a top contact having at least a first portion above the MTJ stack;
a first sidewall spacer surrounding a top portion of the MTJ stack; and
a second sidewall spacer surrounding the first sidewall spacer at the top portion of the MTJ stack,
wherein a top surface of the first sidewall spacer is in direct contact with the first portion of the top contact; the top contact has a second portion with an inner sidewall, the inner sidewall being in direct contact with the second sidewall spacer; and a bottom surface of the second sidewall spacer is coplanar with a bottom surface of the second portion of the top contact.

2. The MRAM structure of claim 1, wherein the first sidewall spacer comprises silicon-nitride (SiN) and the second sidewall spacer comprises a material different from the first sidewall spacer.

3. The MRAM structure of claim 1, wherein the second sidewall spacer comprises a material selected from a group consisting of SiCN, SiOCN, SiON, AlON, $Al_2O_3$, $ZrO_2$, and $SiO_2$.

4. The MRAM structure of claim 1, wherein the MTJ stack comprises, from a bottom to a top thereof, a bottom electrode, a reference layer, a tunnel barrier layer, a free layer, and a top electrode layer, and wherein the MTJ stack sits on top of a bottom contact.

5. The MRAM structure of claim 4, further comprising a bottom contact in contact with the bottom electrode of the MTJ stack, wherein the top contact and the bottom contact are part of two neighboring metal levels of a back-end-of-line (BEOL) structure.

6. A MRAM structure comprising:
a magnetic tunnel junction (MTJ) stack;
a first sidewall spacer surrounding the MTJ stack;
a second sidewall spacer surrounding at least a portion of the first sidewall spacer at a top portion of the MTJ stack; and
a top contact having a first portion above the MTJ stack and a second portion surrounding the second sidewall spacer at the top portion of the MTJ stack,
wherein a bottom surface of the second sidewall spacer is coplanar with a bottom surface of the second portion of the top contact.

7. The MRAM structure of claim 6, wherein the first sidewall spacer is made of silicon-nitride (SiN) and the second sidewall spacer is made of a material different from the first sidewall spacer.

8. The MRAM structure of claim 6, wherein the second sidewall spacer is made of a material selected from a group consisting of SiCN, SiOCN, SiON, AlON, $Al_2O_3$, $ZrO_2$, and $SiO_2$.

9. The MRAM structure of claim 6, wherein the MTJ stack comprises, from a bottom to a top thereof, a bottom electrode, a reference layer, a tunnel barrier layer, a free layer, and a top electrode layer; wherein the MTJ stack sits on top of a bottom contact;
and wherein a bottom surface of the second portion of the top contact is above a level of a top surface of the reference layer.

10. The MRAM structure of claim 9, further comprising a bottom contact in contact with the bottom electrode of the MTJ stack, wherein the top contact and the bottom contact are part of two neighboring metal levels of a back-end-of-line (BEOL) structure.

11. A MRAM structure comprising:
a magnetic tunnel junction (MTJ) stack;
a top contact having at least a first portion above the MTJ stack; and
a first sidewall spacer with a first height, the first sidewall spacer surrounding a top portion of the MTJ stack,
wherein a top surface of the first sidewall spacer being coplanar with a top surface of the MTJ stack,
wherein the MTJ stack comprises, from a bottom to a top thereof, a bottom electrode, a reference layer, a tunnel barrier layer, a free layer, and a top electrode layer, and wherein the bottom electrode is below a bottom surface of the first sidewall spacer.

12. The MRAM structure of claim 11, further comprising:
a second sidewall spacer with a second height, the second sidewall spacer surrounding a top portion of the first sidewall spacer with the second height being smaller than the first height; and
a second portion of the top contact, the second portion of the top contact having an inner sidewall, the inner sidewall being in direct contact with the second sidewall spacer across the second height.

13. The MRAM structure of claim 12, wherein a bottom surface of the second sidewall spacer is coplanar with a bottom surface of the second portion of the top contact.

14. The MRAM structure of claim 12, wherein the first sidewall spacer comprises silicon-nitride (SiN) and the second sidewall spacer comprises a material different from the first sidewall spacer.

15. The MRAM structure of claim 12, wherein the second sidewall spacer comprises a material selected from a group consisting of SiCN, SiOCN, AlON, $Al_2O_3$, $ZrO_2$, and $SiO_2$.

16. The MRAM structure of claim 11, further comprising a bottom contact in contact with the bottom electrode of the MTJ stack, wherein the top contact and the bottom contact are part of two neighboring metal levels of a back-end-of-line (BEOL) structure.

\* \* \* \* \*